(12) United States Patent
Chung et al.

(10) Patent No.: US 8,415,701 B2
(45) Date of Patent: Apr. 9, 2013

(54) LED PACKAGE STRUCTURE FOR INCREASING LIGHT-EMITTING EFFICIENCY AND CONTROLLING LIGHT-PROJECTING ANGLE AND METHOD FOR MANUFACTURING THE SAME

(75) Inventors: Chia-Tin Chung, Miaoli County (TW); Chao-Chin Wu, Taipei (TW); Fang-Kuei Wu, Taoyuan County (TW)

(73) Assignee: Paragon Semiconductor Lighting Technology Co., Ltd., Taoyuan County (TW)

( * ) Notice: Subject to any disclaimer, the term of this patent is extended or adjusted under 35 U.S.C. 154(b) by 0 days.

(21) Appl. No.: 13/160,679

(22) Filed: Jun. 15, 2011

(65) Prior Publication Data
US 2011/0241035 A1    Oct. 6, 2011

Related U.S. Application Data

(62) Division of application No. 12/550,699, filed on Aug. 31, 2009, now Pat. No. 8,187,899.

(30) Foreign Application Priority Data

Jun. 24, 2009   (TW) ................................ 98121155 A

(51) Int. Cl.
*H01L 33/00*   (2010.01)

(52) U.S. Cl.
USPC .............................. 257/98; 257/99; 257/100

(58) Field of Classification Search ............ 257/98–100
See application file for complete search history.

(56) References Cited

U.S. PATENT DOCUMENTS

2007/0189007 A1*   8/2007   Nishimoto et al. ........... 362/227

* cited by examiner

*Primary Examiner* — Samuel Gebremariam
(74) *Attorney, Agent, or Firm* — Houtteman Law LLC

(57) ABSTRACT

An LED package structure for increasing light-emitting efficiency and controlling light-projecting angle includes a substrate unit, a light-emitting unit, a light-reflecting unit and a package unit. The substrate unit has a substrate body and a chip-placing area disposed on a top surface of the substrate body. The light-emitting unit has a plurality of LED chips electrically disposed on the chip-placing area. The light-reflecting unit has an annular reflecting resin body surroundingly formed on the top surface of the substrate body by coating. The annular reflecting resin body surrounds the LED chips that are disposed on the chip-placing area to form a resin position limiting space above the chip-placing area. The package unit has a translucent package resin body disposed on the top surface of the substrate body in order to cover the LED chips. The position of the translucent package resin body is limited in the resin position limiting space.

8 Claims, 9 Drawing Sheets

LED PACKAGE STRUCTURE FOR INCREASING LIGHT-EMITTING EFFICIENCY AND CONTROLLING LIGHT-PROJECTING ANGLE AND METHOD FOR MANUFACTURING THE SAME

CROSS-REFERENCE TO RELATED APPLICATION

This application is a divisional application of U.S. application Ser. No. 12/550,699, filed on Aug. 31, 2009 and entitled "LED PACKAGE STRUCTURE FOR INCREASING LIGHT-EMITTING EFFICIENCY AND CONTROLLING LIGHT-PROJECTING ANGLE AND METHOD FOR MANUFACTURING THE SAME", the entire contents of which are hereby incorporated by reference.

BACKGROUND OF THE INVENTION

1. Field of the Invention

The present invention relates to an LED package structure and a method for manufacturing the same, in particular, to an LED package structure for increasing light-emitting efficiency and controlling light-projecting angle and a method for manufacturing the same.

2. Description of Related Art

The invention of the lamp greatly changed the style of building construction and the living style of human beings, allowing people to work during the night. Without the invention of the lamp, we may stay in the living conditions of ancient civilizations.

Various lamps such as incandescent bulbs, fluorescent bulbs, power-saving bulbs and etc. have been intensively used for indoor illumination. These lamps commonly have the disadvantages of quick attenuation, high power consumption, high heat generation, short working life, high fragility, and being not recyclable. Further, the rapid flow of electrons (about 120 per second) through the electrodes of a regular fluorescent bulb causes an unstable current at the onset of lighting a fluorescent bulb, resulting in a flash of light that is harmful to the sight of the eyes. In order to eliminate this problem, a high frequency electronic ballast may be used. When a fluorescent or power-saving bulb is used with high frequency electronic ballast, it saves about 20% of the consumption of power and eliminates the problem of flashing. However, the high frequency electronic ballast is not detachable when installed in a fluorescent or power-saving bulb, the whole lamp assembly becomes useless if the bulb is damaged. Furthermore, because a fluorescent bulb contains a mercury coating, it may cause pollution to the environment when thrown away after damage.

Hence, LED lamp or LED tube is created in order to solve the above-mentioned questions of the prior lamp. The LED lamp or the LED tube has a plurality of LED chips and a white frame surrounding the LED chips for increasing the light-emitting efficiency of the LED chips. However, the white frame is manufactured by a predetermined mold, so that manufacturing cost is increased. In addition, when the shape of the white frame needs to be changed, the mold needs to be changed according the new shape of the white frame. In other words, the shape of the mold follows the shape of the white frame. Hence, when a new white frame is created for a new product, a new mold needs to be developed.

SUMMARY OF THE INVENTION

In view of the aforementioned issues, the present invention provides an LED package structure for increasing light-emitting efficiency and controlling light-projecting angle and a method for manufacturing the same. The present invention can form an annular reflecting resin body (an annular white resin body) with any shapes by coating method. In addition, the position of a translucent package resin body such as phosphor resin can be limited in the resin position limiting space by using the annular reflecting resin body, and the shape of the translucent package resin body can be adjusted by using the annular reflecting resin body. Therefore, the present invention can apply to increase light-emitting efficiency of LED chips and control light-projecting angle of LED chips.

To achieve the above-mentioned objectives, the present invention provides an LED package structure for increasing light-emitting efficiency and controlling light-projecting angle, including: a substrate unit, a light-emitting unit, a light-reflecting unit and a package unit. The substrate unit has a substrate body and a chip-placing area disposed on a top surface of the substrate body. The light-emitting unit has a plurality of LED chips electrically disposed on the chip-placing area. The light-reflecting unit has an annular reflecting resin body surroundingly formed on the top surface of the substrate body by coating. The annular reflecting resin body surrounds the LED chips that are disposed on the chip-placing area to form a resin position limiting space above the chip-placing area. The package unit has a translucent package resin body disposed on the top surface of the substrate body in order to cover the LED chips. The position of the translucent package resin body is limited in the resin position limiting space.

To achieve the above-mentioned objectives, the present invention provides an LED package substrate for increasing light-emitting efficiency and controlling light-projecting angle, including: a substrate unit and a light-reflecting unit. The substrate unit has a substrate body and a chip-placing area disposed on a top surface of the substrate body. The light-reflecting unit has an annular reflecting resin body surroundingly formed on the top surface of the substrate body by coating. The annular reflecting resin body surrounds the LED chips to form a resin position limiting space above the chip-placing area.

To achieve the above-mentioned objectives, the present invention provides a method of manufacturing an LED package structure for increasing light-emitting efficiency and controlling light-projecting angle, including: providing a substrate unit, and the substrate unit having a substrate body and a chip-placing area disposed on a top surface of the substrate body; and then selectively executing step (a) or (b). The step (a) is: electrically arranging a plurality of LED chips on the chip-placing area of the substrate unit, surroundingly coating liquid resin on the top surface of the substrate body, and then hardening the liquid resin to form an annular reflecting resin body. The step (b) is: surroundingly coating liquid resin on the top surface of the substrate body, hardening the liquid resin to form an annular reflecting resin body, and then electrically arranging a plurality of LED chips on the chip-placing area of the substrate unit. The annular reflecting resin body surrounds the LED chips that are disposed on the chip-placing area to form a resin position limiting space above the chip-placing area. Final, the method includes forming a translucent package resin body on the top surface of the substrate body in order to cover the LED chips, and the position of the translucent package resin body being limited in the resin position limiting space.

In order to further understand the techniques, means and effects the present invention takes for achieving the prescribed objectives, the following detailed descriptions and appended drawings are hereby referred, such that, through

BRIEF DESCRIPTION OF THE DRAWINGS

FIGS. 1A to 4B are schematic views of the LED package structure according to the first embodiment of the present invention, at different stages of the packaging processes, respectively;

DETAILED DESCRIPTION OF THE PREFERRED EMBODIMENTS

Figure 1:
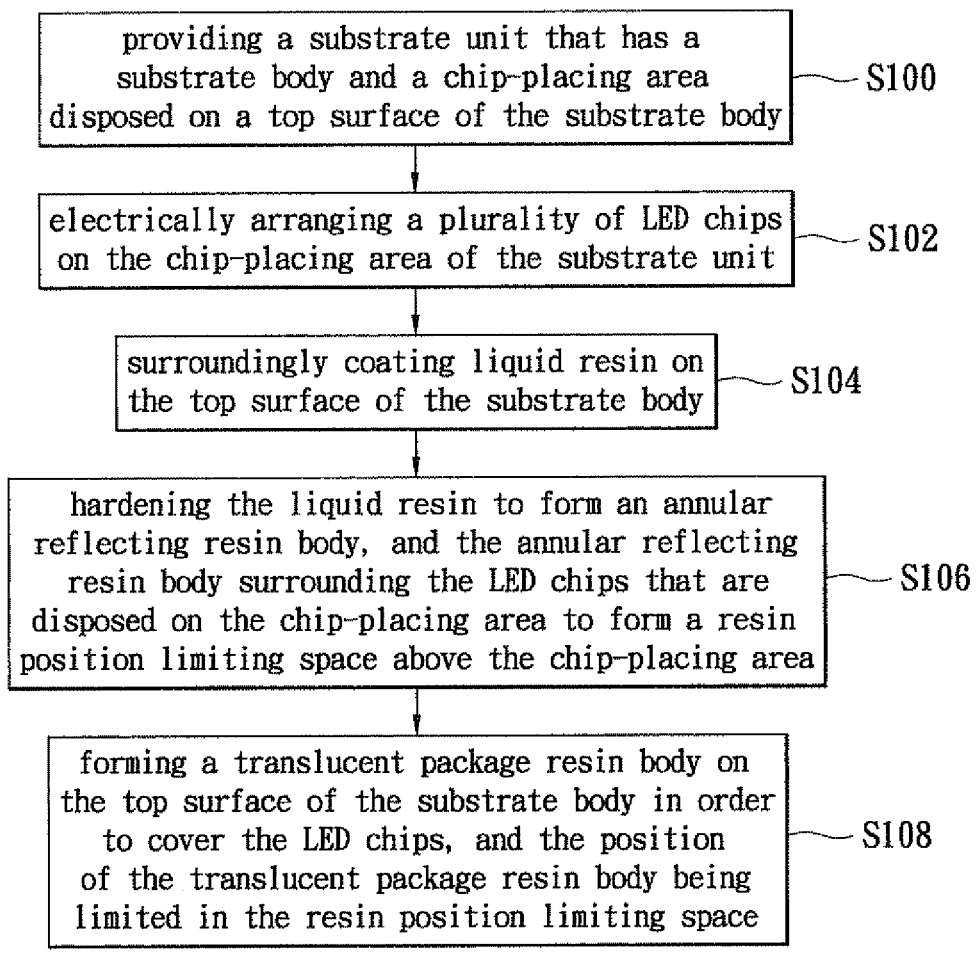
FIG. 1 is a flowchart of the method of manufacturing an LED package structure according to the first embodiment of the present invention.

Referring to FIG. 1, the first embodiment of the present invention provides a method of manufacturing an LED package structure for increasing light-emitting efficiency and controlling light-projecting angle. The method includes: providing a substrate unit that has a substrate body and a chip-placing area disposed on a top surface of the substrate body; electrically arranging a plurality of LED chips on the chip-placing area of the substrate unit; surroundingly coating liquid resin on the top surface of the substrate body; hardening the liquid resin to form an annular reflecting resin body, and the annular reflecting resin body surrounding the LED chips that are disposed on the chip-placing area to form a resin position limiting space above the chip-placing area; and then forming a translucent package resin body on the top surface of the substrate body in order to cover the LED chips, and the position of the translucent package resin body being limited in the resin position limiting space.

Figure 1A:
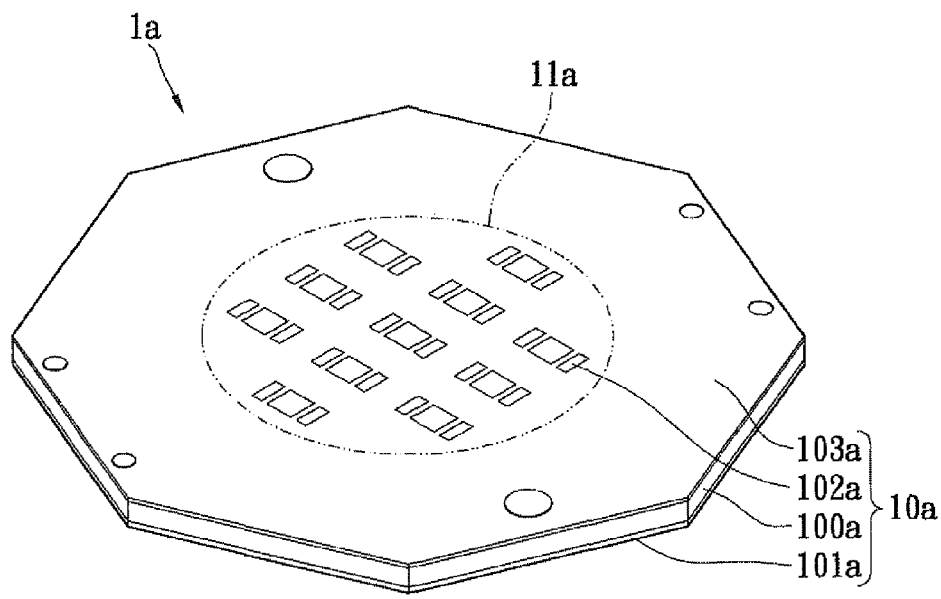
Figure 1B:
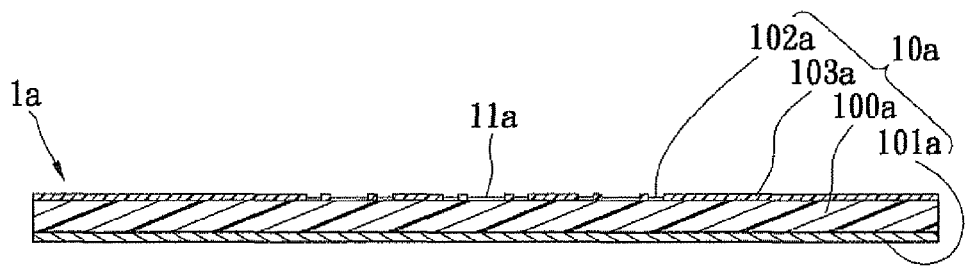

Referring to FIGS. 1 and 1A-4B, the detail descriptions of the first embodiment of the present invention are shown as follows:

Referring to FIGS. 1 and 1A-1B (FIG. 1B is a cross-section of FIG. 1A), the method includes providing a substrate unit 1a that has a substrate body 10a and a chip-placing area 11a disposed on a top surface of the substrate body 10a (step S100). In addition, the substrate body 10a has a circuit substrate 100a, a heat-dissipating layer 101a disposed on a bottom surface of the circuit substrate 100a, a plurality of conductive pads 102a disposed on a top surface of the circuit substrate 100a, and an insulative layer 103a disposed on the top surface of the circuit substrate 100a in order to expose the conductive pads 102a. Hence, the heat-dissipating efficiency of the circuit substrate 100a is increased by using the heat-dissipating layer 101a, and the insulative layer 103a is a solder mask for exposing the conductive pads 102a only in order to achieve local soldering.

However, the above-mentioned definition of the substrate body 10a does not limit the present invention. Any types of substrate can be applied to the present invention. For example, the substrate body 10a can be a PCB (Printed Circuit Board), a flexible substrate, an aluminum substrate, a ceramic substrate, or a copper substrate.

Figure 2A:
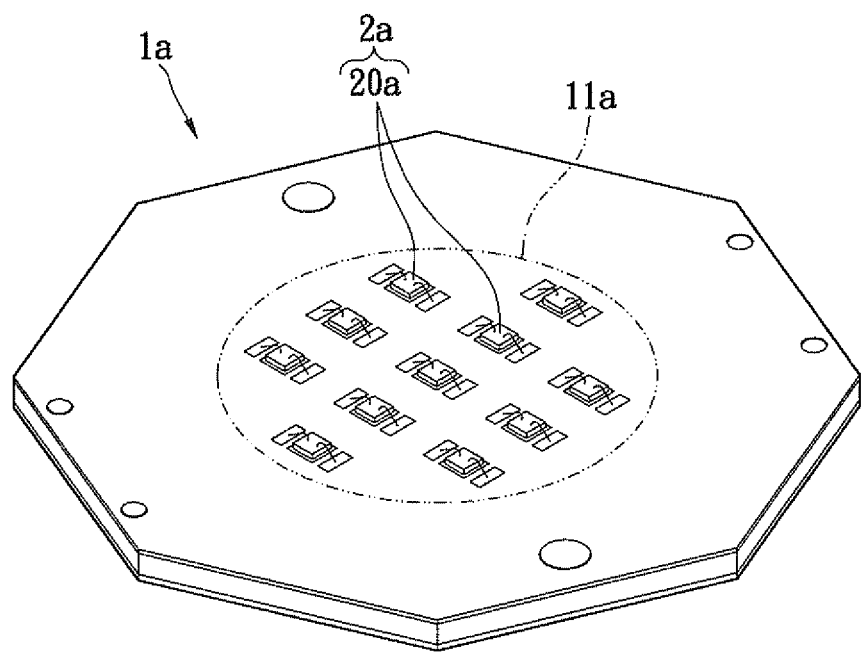
Figure 2B:
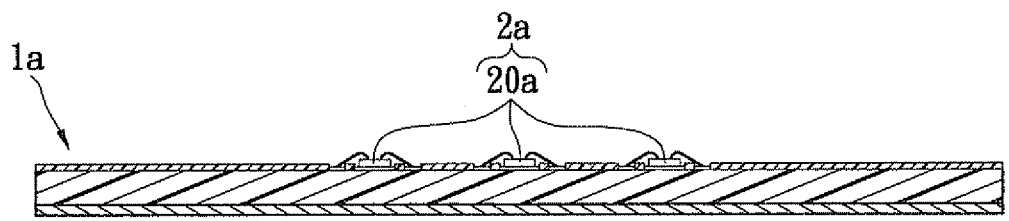

Referring to FIGS. 1 and 2A-2B (FIG. 2B is a cross-section of FIG. 2A), the method includes electrically arranging a plurality of LED chips 20a on the chip-placing area 11a of the substrate unit 1a (step S102). In other words, designer can plan a predetermined chip-placing area 11a on the substrate unit 1a in advance, so that the LED chips 20a can be placed on the chip-placing area 11a of the substrate unit 1a. In the first embodiment, the LED chips 20a are electrically disposed on the chip-placing area 11 a of the substrate unit 1a by wire bonding.

Figure 3A:
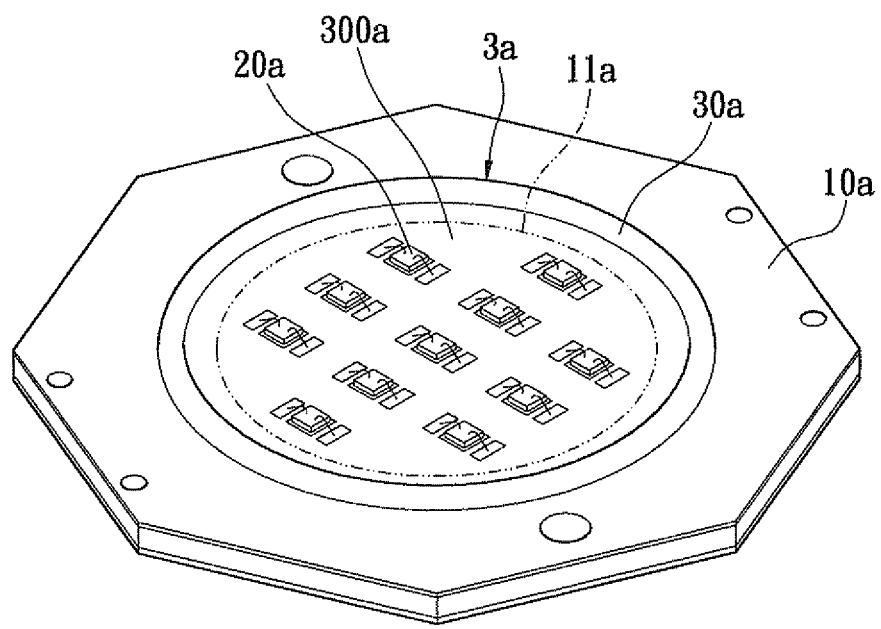
Figure 3B:
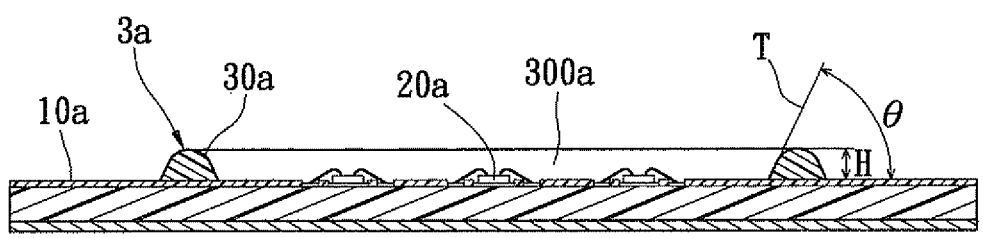

Referring to FIGS. 1 and 3A-3B (FIG. 3B is a cross-section of FIG. 3A), the method includes surroundingly coating liquid resin (not shown) on the top surface of the substrate body 10a (step S104). In addition, the liquid resin can be coated on the substrate body 10a by any shapes according to different requirements (such as a circular shape, a square or a rectangular shape etc.). The thixotropic index of the liquid resin is between 4 and 6, the pressure of coating the liquid resin on the top surface of the substrate body 10a is between 350 kpa and 450 kpa, and the velocity of coating the liquid resin on the top surface of the substrate body 10a is between 5 mm/s and 15 mm/s. The liquid resin is surroundingly coated on the top surface of the substrate body 10a from a start point to a termination point, and the position of the start point and the position of the termination point are the same. Furthermore, after the step S104, the method includes hardening the liquid resin to form an annular reflecting resin body 30a, and the annular reflecting resin body 30a surrounding the LED chips 20a that are disposed on the chip-placing area 11a to form a resin position limiting space 300a above the chip-placing area 11a (step S106). In addition, the liquid resin is hardened by baking, the baking temperature is between 120° C. and 140° C., and the baking time is between 20 minute and 40 minute.

Moreover, the annular reflecting resin body 30a has an arc shape formed on a top surface thereof. The annular reflecting resin body 30a has a radius tangent T, and the angle θ of the radius tangent T relative to the top surface of the substrate body 10a is between 40° C. and 50° C. The maximum height H of the annular reflecting resin body 30a relative to the top surface of the substrate body 10a is between 0.3 mm and 0.7 mm, and the width of a bottom side of the annular reflecting resin body 30a is between 1.5 mm and 3 mm. The thixotropic index of the annular reflecting resin body 30a is between 4 and 6. In addition, the resin position limiting space 300a has a cross section that can be a circular shape, an elliptical shape or a polygonal shape (such as a square or a rectangular shape etc). In the first embodiment, the cross section of the resin position limiting space 300a is a circular shape.

Figure 4A:
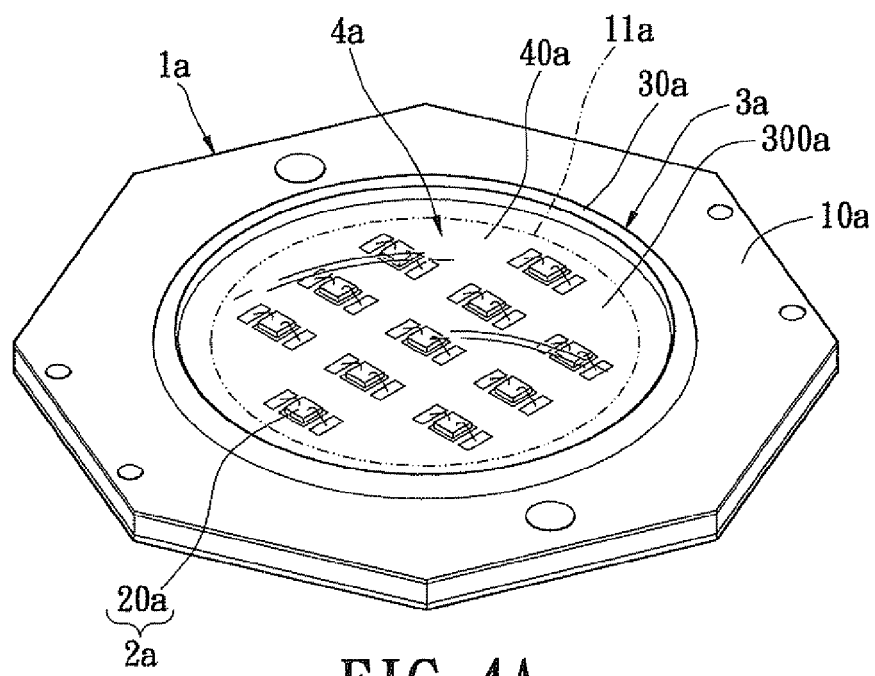
Figure 4B:
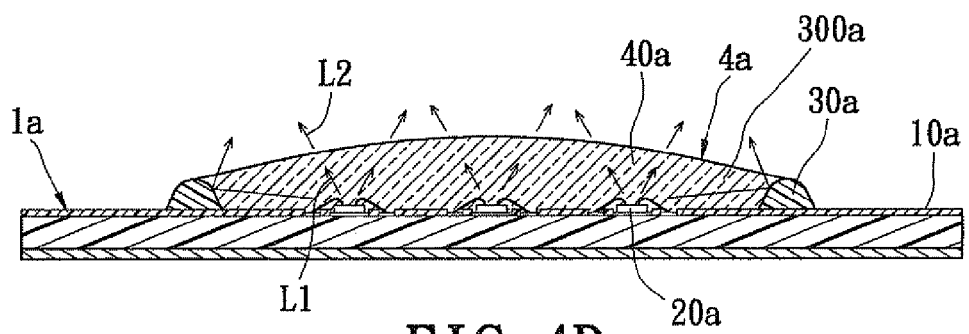

Referring to FIGS. 1 and 4A-4B (FIG. 4B is a cross-section of FIG. 4A), the method includes forming a translucent package resin body 40a on the top surface of the substrate body 10a in order to cover the LED chips 20a, and the position of the translucent package resin body 40a being limited in the resin position limiting space 300a (step S 108). In addition, the annular reflecting resin body 30a can be a white thermo-hardening reflecting body (opaque resin) mixed with inorganic additive, and the top surface of the translucent package resin body 40a is convex.

In the first embodiment, each LED chip 20a can be a blue LED chip, and the translucent package resin body 40a can be a phosphor body. Hence, blue light beams L1 generated by the LED chips 20a (the blue LED chips) can pass through the translucent package resin body 40a (the phosphor body) to generate white light beams L2 that are similar to the light source generate by sun lamp.

In other words, the translucent package resin body 40a is limited in the resin position limiting space 300a by using the annular reflecting resin body 30a in order to control the usage quantity of the translucent package resin body 40a. In addition, the surface shape and the height of the translucent package resin body 40a can be adjusted by control the usage quantity of the translucent package resin body 40a in order to light-projecting angles of the white light beams L2. Moreover, the blue light beams L1 generated by the LED chips 20a can be reflected by an inner wall of the annular reflecting resin body 30a in order to increase the light-emitting efficiency of the LED package structure of the present invention.

Figure 5:
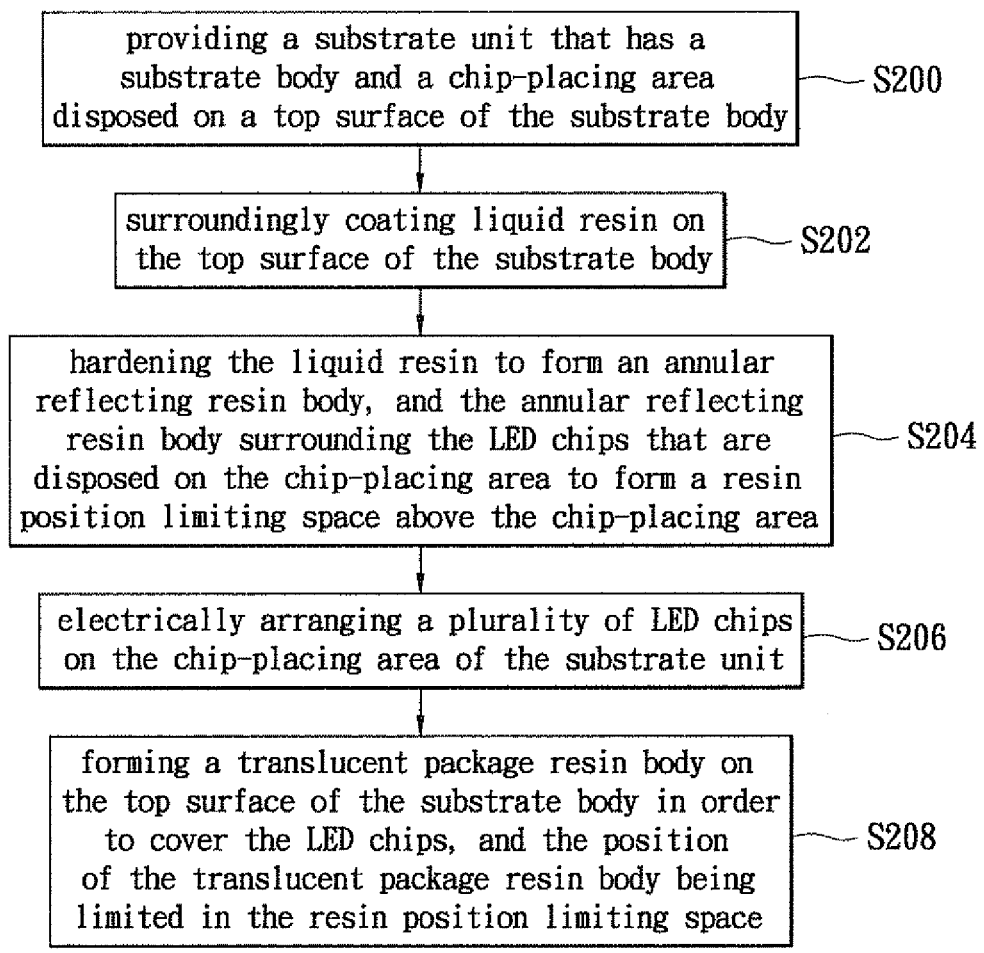
FIG. 5 is a flowchart of the method of manufacturing an LED package structure according to the second embodiment of the present invention.

Referring to FIG. 5, the second embodiment of the present invention provides a method of manufacturing an LED package structure for increasing light-emitting efficiency and controlling light-projecting angle. The method includes: providing a substrate unit that has a substrate body and a chip-placing area disposed on a top surface of the substrate body; surroundingly coating liquid resin on the top surface of the substrate body; hardening the liquid resin to form an annular reflecting resin body, and the annular reflecting resin body surrounding the LED chips that are disposed on the chip-placing area to form a resin position limiting space above the chip-placing area; electrically arranging a plurality of LED chips on the chip-placing area of the substrate unit; and then forming a translucent package resin body on the top surface of the substrate body in order to cover the LED chips, and the position of the translucent package resin body being limited in the resin position limiting space.

Figure 5A:
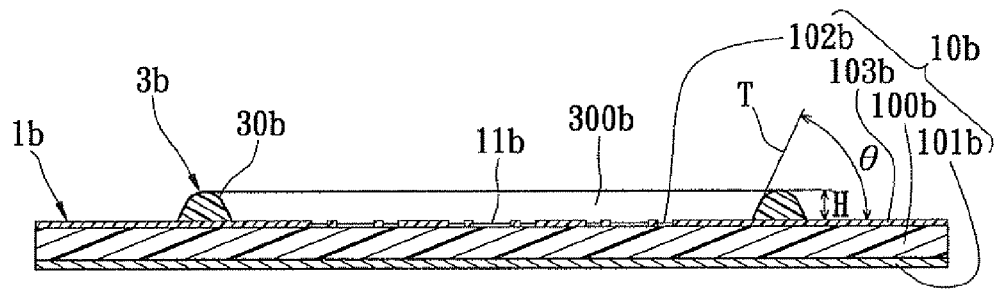
FIGS. 5A to 5C are schematic views of the LED package structure according to the second embodiment of the present invention, at different stages of the packaging processes, respectively.

Referring to FIGS. 5 and 5A-5C, the detail descriptions of the second embodiment of the present invention are shown as follows:

Referring to FIGS. 5 and 5A, the method includes providing a substrate unit 1b that has a substrate body 10b and a chip-placing area 11b disposed on a top surface of the substrate body 10b (step S200). In addition, the substrate body 10b has a circuit substrate 100b, a heat-dissipating layer 101b disposed on a bottom surface of the circuit substrate 100b, a plurality of conductive pads 102b disposed on a top surface of the circuit substrate 100b, and an insulative layer 103b disposed on the top surface of the circuit substrate 100b in order to expose the conductive pads 102b.

Referring to FIGS. 5 and 5A, the method includes surroundingly coating liquid resin (not shown) on the top surface of the substrate body 10b (step S202). In addition, the liquid resin can be coated on the substrate body 10b by any shapes according to different requirements (such as a circular shape, a square or a rectangular shape etc.). The thixotropic index of the liquid resin is between 4 and 6, the pressure of coating the liquid resin on the top surface of the substrate body 10b is between 350 kpa and 450 kpa, and the velocity of coating the liquid resin on the top surface of the substrate body 10b is between 5 mm/s and 15 mm/s. The liquid resin is surroundingly coated on the top surface of the substrate body In from a start point to a termination point, and the position of the start point and the position of the termination point are the same. Furthermore, after the step S202, the method includes hardening the liquid resin to form an annular reflecting resin body 30b, and the annular reflecting resin body 30b surrounding the LED chips 20b that are disposed on the chip-placing area 11b to form a resin position limiting space 300b above the chip-placing area 11b (step S204). In addition, the liquid resin is hardened by baking, the baking temperature is between 120° C. and 140° C., and the baking time is between 20 minute and 40 minute.

Moreover, the annular reflecting resin body 30b has an arc shape formed on a top surface thereof. The annular reflecting resin body 30b has a radius tangent T, and the angle θ of the radius tangent T relative to the top surface of the substrate body 10h is between 40° C. and 50° C. The maximum height H of the annular reflecting resin body 30b relative to the top surface of the substrate body 10b is between 0.3 mm and 0.7 mm, and the width of a bottom side of the annular reflecting resin body 30b is between 1.5 mm and 3 mm, The thixotropic index of the annular reflecting resin body 30b is between 4 and 6. In addition, the resin position limiting space 300b has a cross section that can be a circular shape, an elliptical shape or a polygonal shape (such as a square or a rectangular shape etc).

Figure 5B:
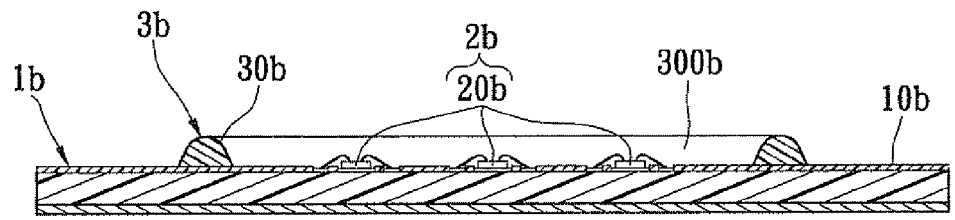

Referring to FIGS. 5 and 5B, the method includes electrically arranging a plurality of LED chips 20h on the chip-placing area 11b of the substrate unit 1b (step S206). In other words, designer can plan a predetermined chip-placing area 11b on the substrate unit 1b in advance, so that the LED chips 20b can be placed on the chip-placing area 11b of the substrate unit 1b by wire bonding.

Figure 5C:
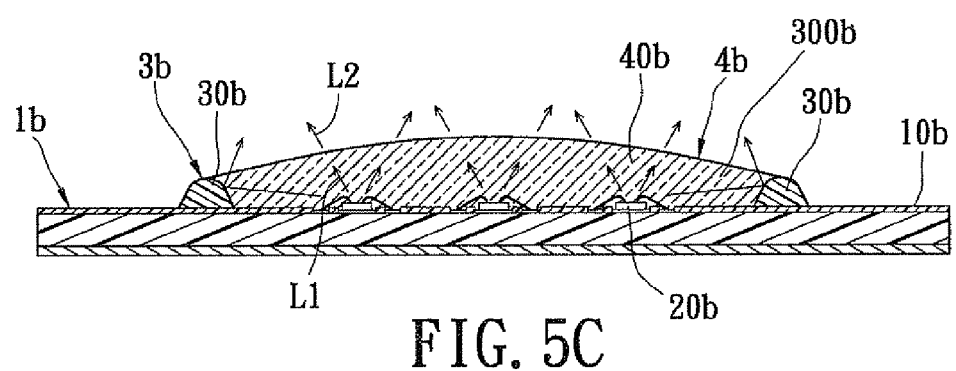

Referring to FIGS. 5 and 5C, the method includes forming a translucent package resin body 40b on the top surface of the substrate body 10b in order to cover the LED chips 20b, and the position of the translucent package resin body 40b being limited in the resin position limiting space 300b (step S208). In addition, the annular reflecting resin body 30b can be a white thermohardening reflecting body (opaque resin) mixed with inorganic additive, and the top surface of the translucent package resin body 40b is convex.

In the second embodiment, each LED chip 20b can be a blue LED chip, and the translucent package resin body 40b can be a phosphor body. Hence, blue light beams L1 generated by the LED chips 20b (the blue LED chips) can pass through the translucent package resin body 40b (the phosphor body) to generate white light beams L2 that are similar to the light source generate by sun lamp.

Hence, referring to FIGS. 1 and 5, the present invention provides a method of manufacturing an LED package structure for increasing light-emitting efficiency and controlling light-projecting angle, including: providing a substrate unit, and the substrate unit having a substrate body and a chip-placing area disposed on a top surface of the substrate body; and then selectively executing step (a) or (b). The step (a) is: electrically arranging a plurality of LED chips on the chip-placing area of the substrate unit, surroundingly coating liquid resin on the top surface of the substrate body, and then hardening the liquid resin to form an annular reflecting resin body. The step (b) is: surroundingly coating liquid resin on the top surface of the substrate body, hardening the liquid resin to form an annular reflecting resin body, and then electrically arranging a plurality of LED chips on the chip-placing area of the substrate unit. The annular reflecting resin body surrounds the LED chips that are disposed on the chip-placing area to form a resin position limiting space above the chip-placing area. Final, the method includes forming a translucent package resin body on the top surface of the substrate body in order to cover the LED chips, and the position of the translucent package resin body being limited in the resin position limiting space.

Furthermore, referring to FIGS. 4A, 4B and 5C, the present invention provides an LED package structure for increasing light-emitting efficiency and controlling light-projecting angle by using the above-mentioned manufacturing method. The LED package structure includes a substrate unit (1a, 1b), a light-emitting unit (2a, 2b), a light-reflecting unit (3a, 3b) and a package unit (4a, 4b).

The substrate unit (1a, 1b) has a substrate body (10a, 10b) and a chip-placing area (11a, 11b) disposed on a top surface of the substrate body (10a, 10b). The light-emitting unit (2a, 2b) has a plurality of LED chips (20a, 20b) electrically disposed on the chip-placing area (11a, 11b).

Moreover, the light-reflecting unit (3a, 3b) has an annular reflecting resin body (30a, 30b) surroundingly formed on the top surface of the substrate body (10a, 10b) by coating. The annular reflecting resin body (30a, 30b) surrounds the LED chips (20a, 20b) that are disposed on the chip-placing area (11a, 11b) to form a resin position limiting space (300a, 300b) above the chip-placing area (11a, 11b).

In addition, the package unit (4a, 4b) has a translucent package resin body (40a, 40b) disposed on the top surface of the substrate body (10a, 10b) in order to cover the LED chips (20a, 20b). The position of the translucent package resin body (40a, 40b) is limited in the resin position limiting space (300a, 300b).

Furthermore, the substrate unit (1a, 1b) and the light-reflecting unit (3a, 3b) can be combined to form an LED package structure for increasing light-emitting efficiency and controlling light-projecting angle. In other words, any types of light-emitting elements can be applied to the LED package structure.

Figure 6:
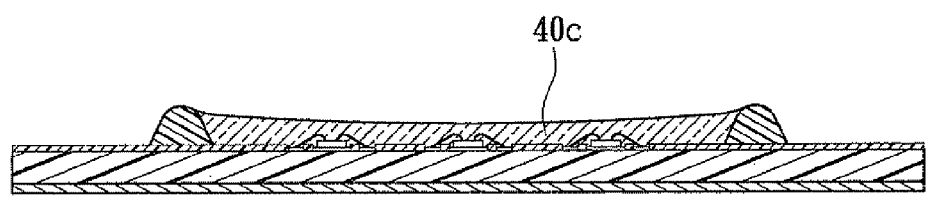
FIG. 6 is a cross-sectional, schematic view of the LED package structure according to the third embodiment of the present invention.

Referring to FIG. 6, the difference between the third embodiment and the first and the second embodiments is that: the top surface of the translucent package resin body 40c is concave. Of course, the top surface of the translucent package resin body 40c also can be plane (not shown).

Figure 7A:
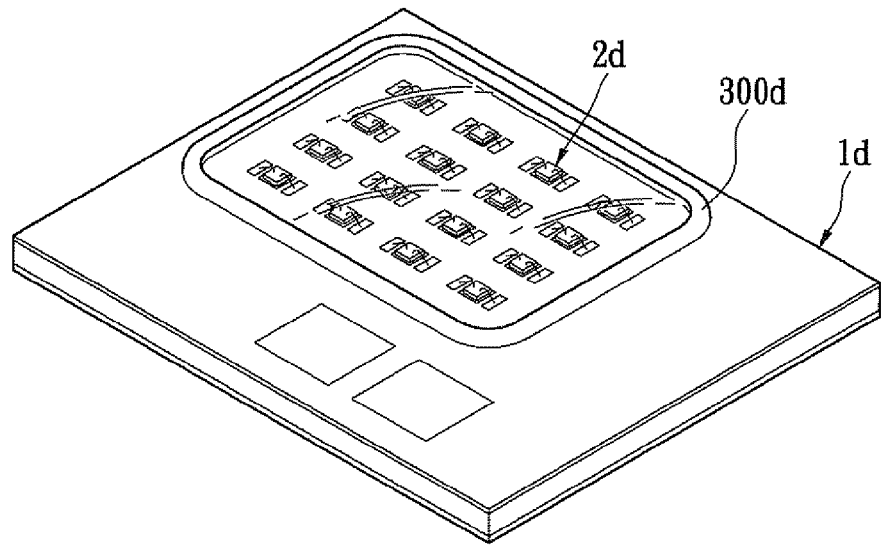
FIG. 7A is a perspective, schematic view of the LED package structure according to the fourth embodiment of the present invention.
Figure 7B:
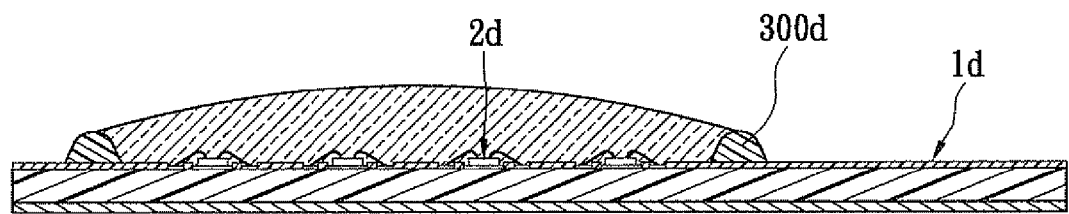
FIG. 7B is a cross-sectional, schematic view of the LED package structure according to the fourth embodiment of the present invention.

Referring to FIGS. 7A and 7B, the difference between the fourth embodiment and the first and the second embodiments is that: in the fourth embodiment, the resin position limiting space 300d has a cross section as a square. Hence, the LED package structure of the fourth embodiment can generate a light-emitting area similar to a square. In other words, the cross-sectional area of the substrate unit 1d is increased (the heat-dissipating area of the substrate unit 1d is increased) in order to increase the heat-dissipating efficiency of the light-emitting unit 2d.

Figure 8A:
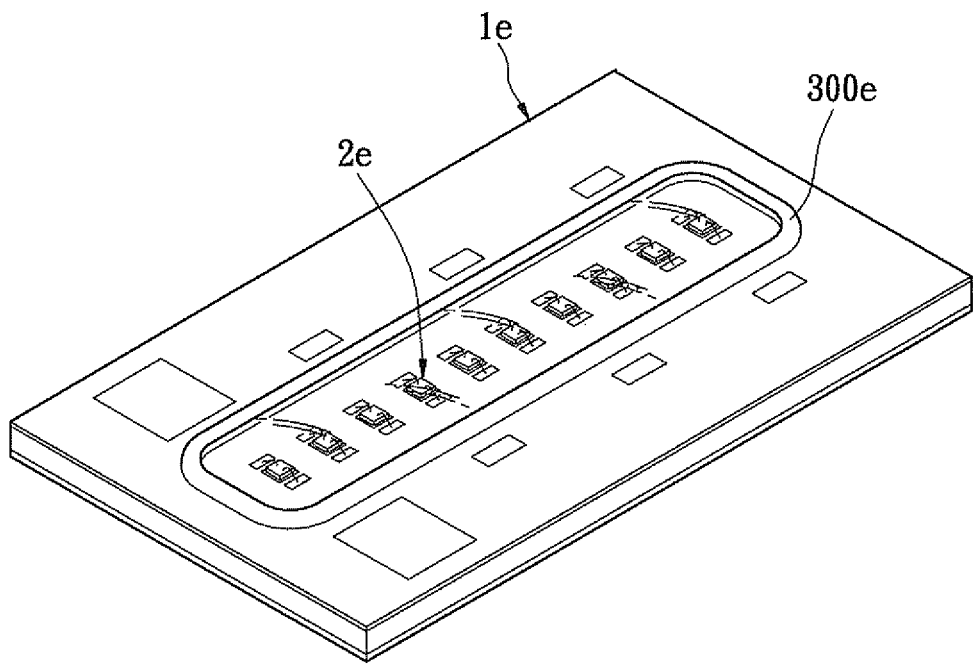
FIG. 8A is a perspective, schematic view of the LED package structure according to the fifth embodiment of the present invention.
Figure 8B:
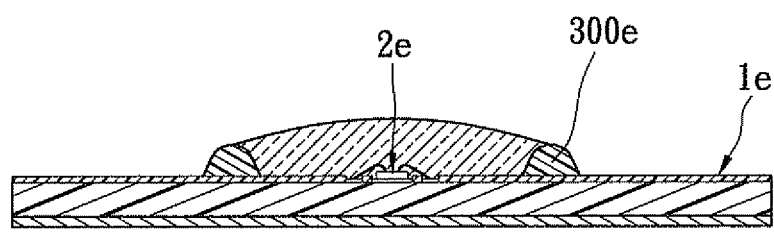
FIG. 8B is a cross-sectional, schematic view of the LED package structure according to the fifth embodiment of the present invention.

Referring to FIGS. 8A and 8B, the difference between the fifth embodiment and the first and the second embodiments is that: in the fifth embodiment, the resin position limiting space 300e has a cross section as a rectangular form. Hence, the LED package structure of the fourth embodiment can generate a light-emitting area similar to a long strip shape. In other words, the cross-sectional area of the substrate unit 1e is increased (the heat-dissipating area of the substrate unit 1e is increased) in order to increase the heat-dissipating efficiency of the light-emitting unit 2e.

In conclusion, the present invention can form an annular reflecting resin body (an annular white resin body) with any shapes by coating method. In addition, the position of a translucent package resin body such as phosphor resin can be limited in the resin position limiting space by using the annular reflecting resin body, and the shape of the translucent package resin body can be adjusted by using the annular reflecting resin body. Therefore, the present invention can apply to increase light-emitting efficiency of LED chips and control light-projecting angle of LED chips.

In other words, the translucent package resin body is limited in the resin position limiting space by using the annular reflecting resin body in order to control the usage quantity of the translucent package resin body. In addition, the surface shape and the height of the translucent package resin body can be adjusted by control the usage quantity of the translucent package resin body in order to light-projecting angles of the white light beams. Moreover, the blue light beams generated by the LED chips can be reflected by an inner wall of the annular reflecting resin body in order to increase the light-emitting efficiency of the LED package structure of the present invention.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. An LED package structure, comprising:
    a substrate unit including a substrate body;
    a light-emitting unit including a plurality of LED chips disposed on the substrate body and electrically connected to the substrate body;
    a light-reflecting unit including a surrounding light-reflecting resin body surroundingly coated on the substrate body to surround the LED chips, wherein the surrounding light-reflecting resin body is extended from an initial point to a terminal point, and the position of the initial point and the position of the terminal point are substantially the same, thus two end portions of the surrounding light-reflecting resin body are substantially overlapping; and
    a package unit including a light-transmitting package resin body disposed on the substrate body to cover the LED chips, wherein the position of the light-transmitting package resin body is limited by the surrounding light-reflecting resin body.

2. The LED package structure according to claim 1, wherein the substrate body has a circuit substrate, a heat-dissipating layer disposed on a bottom surface of the circuit substrate, a plurality of conductive pads disposed on a top surface of the circuit substrate, and an insulative layer disposed on the top surface of the circuit substrate in order to expose the conductive pads.

3. The LED package structure according to claim 1, wherein each LED chip is a blue LED chip, and the light-transmitting package resin body is a phosphor body.

4. The LED package structure according to claim 1, wherein the surrounding light-reflecting resin body has an arc shape formed on a top surface thereof.

5. The LED package structure according to claim 1, wherein the surrounding light-reflecting resin body has a radius tangent, and the angle of the radius tangent relative to the top surface of the substrate body is between 40° and 50°.

6. The LED package structure according to claim 1, wherein the maximum height of the surrounding light-reflecting resin body relative to the top surface of the substrate body is between 0.3 mm and 0.7 mm, and the width of a bottom side of the surrounding light-reflecting resin body is between 1.5 mm and 3 mm.

7. The LED package structure according to claim 1, wherein the thixotropic index of the surrounding light-reflecting resin body is between 4 and 6.

8. The LED package structure according to claim 1, wherein the surrounding light-reflecting resin body is formed by mixing a white thermohardening reflecting body with an inorganic additive.

* * * * *